US008159651B2

(12) United States Patent
Visser et al.

(10) Patent No.: US 8,159,651 B2
(45) Date of Patent: Apr. 17, 2012

(54) ILLUMINATION SYSTEM COHERENCE REMOVER WITH A SERIES OF PARTIALLY REFLECTIVE SURFACES

(75) Inventors: Huibert Visser, Zevenhuizen (NL); Jacob Fredrik Friso Klinkhamer, Delft (NL); Lev Ryzhikov, Norwalk, CT (US); Scott D. Coston, New Milford, CT (US); Adel Joobeur, Milford, CT (US); Rob Vink, Delft (NL); Yevgeniy Shmarev, Lagrangeville, NY (US)

(73) Assignees: ASML Holding N.V., Veldhoven (NL); ASML Netherlands B.V., Veldhoven (NL)

(*) Notice: Subject to any disclaimer, the term of this patent is extended or adjusted under 35 U.S.C. 154(b) by 189 days.

(21) Appl. No.: 12/328,204

(22) Filed: Dec. 4, 2008

(65) Prior Publication Data
US 2009/0168072 A1    Jul. 2, 2009

Related U.S. Application Data

(62) Division of application No. 11/292,275, filed on Dec. 2, 2005, now abandoned.

(51) Int. Cl.
    *G03B 27/72* (2006.01)
(52) U.S. Cl. .................................................... 355/71
(58) Field of Classification Search ............ 355/71, 355/35, 67, 53; 356/497
    See application file for complete search history.

(56) References Cited

U.S. PATENT DOCUMENTS

| 4,547,044 A | 10/1985 | Jain et al. |
| 4,619,508 A | 10/1986 | Shibuya et al. |
| 4,744,615 A | 5/1988 | Fan et al. |
| 4,974,919 A | 12/1990 | Muraki et al. |
| 5,153,773 A * | 10/1992 | Muraki et al. ............. 359/619 |
| 5,229,872 A | 7/1993 | Mumola |
| 5,296,891 A | 3/1994 | Vogt et al. |
| 5,317,450 A | 5/1994 | Kamon |
| 5,500,736 A | 3/1996 | Koitabashi et al. |
| 5,523,193 A | 6/1996 | Nelson |
| 5,530,482 A | 6/1996 | Gove et al. |
| 5,579,147 A | 11/1996 | Mori et al. |
| 5,677,703 A | 10/1997 | Bhuva et al. |
| 5,724,122 A | 3/1998 | Oskotsky |
| 5,808,797 A | 9/1998 | Bloom et al. |

(Continued)

FOREIGN PATENT DOCUMENTS
EP    0 230 931 A2    8/1987
(Continued)

OTHER PUBLICATIONS

Notification of Reasons for Refusal mailed Aug. 3, 2010 for Japanese Patent Application No. 2006-325363, 4 pgs.

(Continued)

*Primary Examiner* — Peter B Kim
*Assistant Examiner* — Chia-how Michael Liu
(74) *Attorney, Agent, or Firm* — Sterne, Kessler, Goldstein & Fox P.L.L.C.

(57) ABSTRACT

A coherence remover includes a first partially reflective surface and a second partially reflective surface. The coherence remover is configured to receive an input beam. Each of the first and second reflective surfaces is configured to reflect a respective portion of the input beam to produce respective one or more intermediate beams. The intermediate beams collectively form an output beam that has a reduced coherence compared to the input beam.

10 Claims, 11 Drawing Sheets

U.S. PATENT DOCUMENTS

| | | | |
|---|---|---|---|
| 5,982,553 | A | 11/1999 | Bloom et al. |
| 6,069,739 | A | 5/2000 | Borodovsky et al. |
| 6,133,986 | A | 10/2000 | Johnson |
| 6,177,980 | B1 | 1/2001 | Johnson |
| 6,312,134 | B1 | 11/2001 | Jain et al. |
| 6,587,182 | B1 | 7/2003 | Goto |
| 6,590,698 | B1 | 7/2003 | Ohtsuki et al. |
| 6,687,041 | B1 | 2/2004 | Sandstrom |
| 6,747,783 | B1 | 6/2004 | Sandstrom |
| 6,795,169 | B2 | 9/2004 | Tanaka et al. |
| 6,806,897 | B2 | 10/2004 | Kataoka et al. |
| 6,811,953 | B2 | 11/2004 | Hatada et al. |
| 6,819,490 | B2 | 11/2004 | Sandstrom et al. |
| 7,081,947 | B2 | 7/2006 | Gui et al. |
| 2004/0041104 | A1 | 3/2004 | Liebregts et al. |
| 2004/0130561 | A1 | 7/2004 | Jain |
| 2004/0239904 | A1 | 12/2004 | Nishinaga |
| 2005/0007572 | A1 | 1/2005 | George et al. |
| 2007/0127005 | A1 | 6/2007 | Visser et al. |
| 2007/0247606 | A1 | 10/2007 | Visser et al. |

FOREIGN PATENT DOCUMENTS

| | | |
|---|---|---|
| EP | 0 282 593 A1 | 9/1988 |
| EP | 1 063 742 A1 | 12/2000 |
| EP | 1 076 359 A2 | 2/2001 |
| EP | 1 521 110 A1 | 4/2005 |
| EP | 1 569 035 A1 | 8/2005 |
| JP | 59-184317 A | 10/1984 |
| JP | 62-178904 A | 8/1987 |
| JP | 1-152411 A | 6/1989 |
| JP | 2000-200747 A | 7/2000 |
| JP | 2003-167213 A | 6/2003 |
| JP | 2005-244238 A | 9/2005 |
| WO | WO 98/33096 A1 | 7/1998 |
| WO | WO 98/38597 A2 | 9/1998 |
| WO | WO 98/38597 A3 | 9/1998 |
| WO | WO 03/023833 A1 | 3/2003 |
| WO | WO 03/029875 A2 | 4/2003 |
| WO | WO 03/040830 A2 | 5/2003 |
| WO | WO 2005/019900 A1 | 3/2005 |
| WO | WO 2006/013814 A1 | 2/2006 |

OTHER PUBLICATIONS

Translation of Office Action for Korean Application No. 10-2006-0120808 completed on Oct. 26, 2007, 3 pages.

Search Report for European Application No. 06255958.8-2222 completed on Oct. 10, 2007, 9 pages.

Search Report and Written Opinion for Singapore Application No. 200608342-2 mailed Sep. 26, 2008, 7 pgs.

Non-Final Rejection mailed Jun. 6, 2008 for U.S. Appl. No. 11/292,275, filed Dec. 2, 2005, 12 pgs.

Non-Final Rejection mailed Jun. 6, 2008 for U.S. Appl. No. 11/606,386, filed Nov. 30, 2006, 14 pgs.

Visser et al., "Illumination System", U.S. Appl. No. 12/328,251, filed Dec. 4, 2008.

Notification of Reason for Refusal mailed Jan. 26, 2010 for Japanese Patent Application No. 2006-325363, 3 pgs.

English Abstract for Japanese Publication No. JP2005-503018T published Jan. 27, 2005, 1 pg.

Non-Final Rejection mailed Nov. 30, 2010, directed to co-pending U.S. Appl. No. 12/328,251, filed Dec. 4, 2008; 16 pages.

U.S. Final Office Action directed to co-pending U.S. Appl. No. 12/328,251, filed Dec. 4, 2008, mailed Apr. 11, 2011; 16 pages.

* cited by examiner

ILLUMINATION SYSTEM COHERENCE REMOVER WITH A SERIES OF PARTIALLY REFLECTIVE SURFACES

CROSS REFERENCE TO RELATED APPLICATIONS

This application is a divisional of U.S. application Ser. No. 11/292,275, filed Dec. 2, 2005 (now abandoned), which is incorporated by reference herein in its entirety. This application is related to U.S. application Ser. No. 12/328,251, filed Dec. 4, 2008, which is incorporated by reference herein in its entirety.

BACKGROUND

1. Field of the Invention

The present invention relates to an optical apparatus, suitable for use as part of a lithographic apparatus.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (resist) provided on the substrate.

Instead of a circuit pattern, the patterning means can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

Some conventional systems use an illumination source that produces a plurality of beams of radiation, which are individually patterned and projected on the substrate. However, this can lead to light that is not uniform in intensity or other characteristics across all the beams. When trying to homogenize these light beams in conventional systems, interference problems can arise due to the overlap of coherent beams.

What is needed is an optical apparatus for substantially homogenizing and removing at least some coherence from a beam of light.

SUMMARY

In one embodiment of the present invention, there is provided a coherence remover. The coherence remover includes a first partially reflective surface and a second partially reflective surface. The coherence remover is configured to receive an input beam. Each of the first and second reflective surfaces is configured to reflect a respective portion of the input beam to produce respective one or more intermediate beams. The intermediate beams collectively form an output beam that has a reduced coherence compared to the input beam.

According to another embodiment of the invention there is provided a lithographic apparatus a coherence remover and a homogenizer. The coherence remover includes a first partially reflective surface and a second partially reflective surface. The coherence remover is configured to receive an input beam. Each of the first and second reflective surfaces is configured to reflect a respective portion of the input beam to produce respective one or more intermediate beams. The intermediate beams collectively form the output beam that has a reduced coherence compared to the input beam. The homogenizer is configured to convert the output beam of the coherence remover into a plurality of beams.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
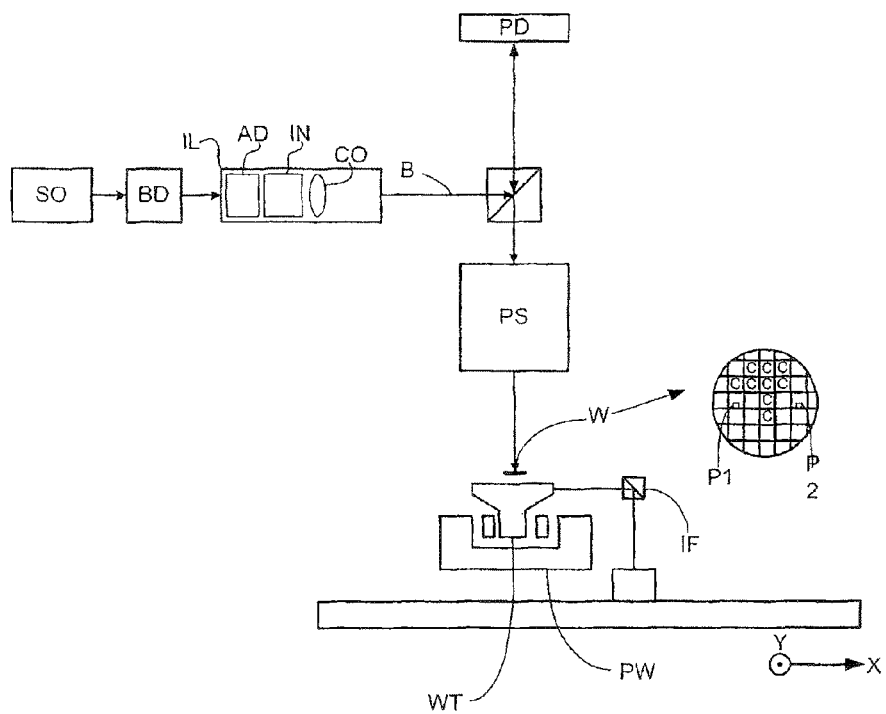
FIGS. 1 and 2 depict lithographic apparatus, according to various embodiments of the present invention.

The present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

FIG. 1 schematically depicts the lithographic apparatus of one embodiment of the invention. The apparatus comprises an illumination system IL, a patterning device PD, a substrate table WT, and a projection system PS. The illumination system (illuminator) IL is configured to condition a radiation beam B (e.g., UV radiation).

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam can not exactly correspond to the desired pattern in the target portion of the substrate, for example if the pattern includes phase-shifting features or so called assist features. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1000, at least 10000, at least 100000, at least 1000000, or at least 10000000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

In example where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm.

In examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. In one example, the wafer is a III/V compound semiconductor wafer. In one example, the wafer is a silicon wafer. In an embodiment, the substrate is a ceramic substrate. In one example, the substrate is a glass substrate. In one example, the substrate is a plastic substrate. In one example, the substrate is transparent (for the naked human eye). In one example, the substrate is colored. In one example, the substrate is absent a color.

The thickness of the substrate can vary and, to an extent, can depend, e.g., on the substrate material and/or the substrate dimensions. In one example, the thickness is at least 50 µm, e.g., at least 100 µm, at least 200 µm, at least 300 µm, at least 400 µm, at least 500 µm, or at least 600 µm. In one example, the thickness of the substrate is at most 5000 µm, e.g., at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1000 focus elements, at least 10000 focus elements, at least 100000 focus elements, or at least 1000000 focus elements. In one example, the number of individually controllable elements in the patterning device is equal to or greater than the number of focusing elements in the array of focusing elements. In one example, one or more (e.g., 1000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of actuators) at least in the direction to and away from the substrate, e.g., with the use of one or more actuators. Being able to move the MLA to and away from the substrate allows, e.g., for focus adjustment without having to move the substrate.

Figure 2:
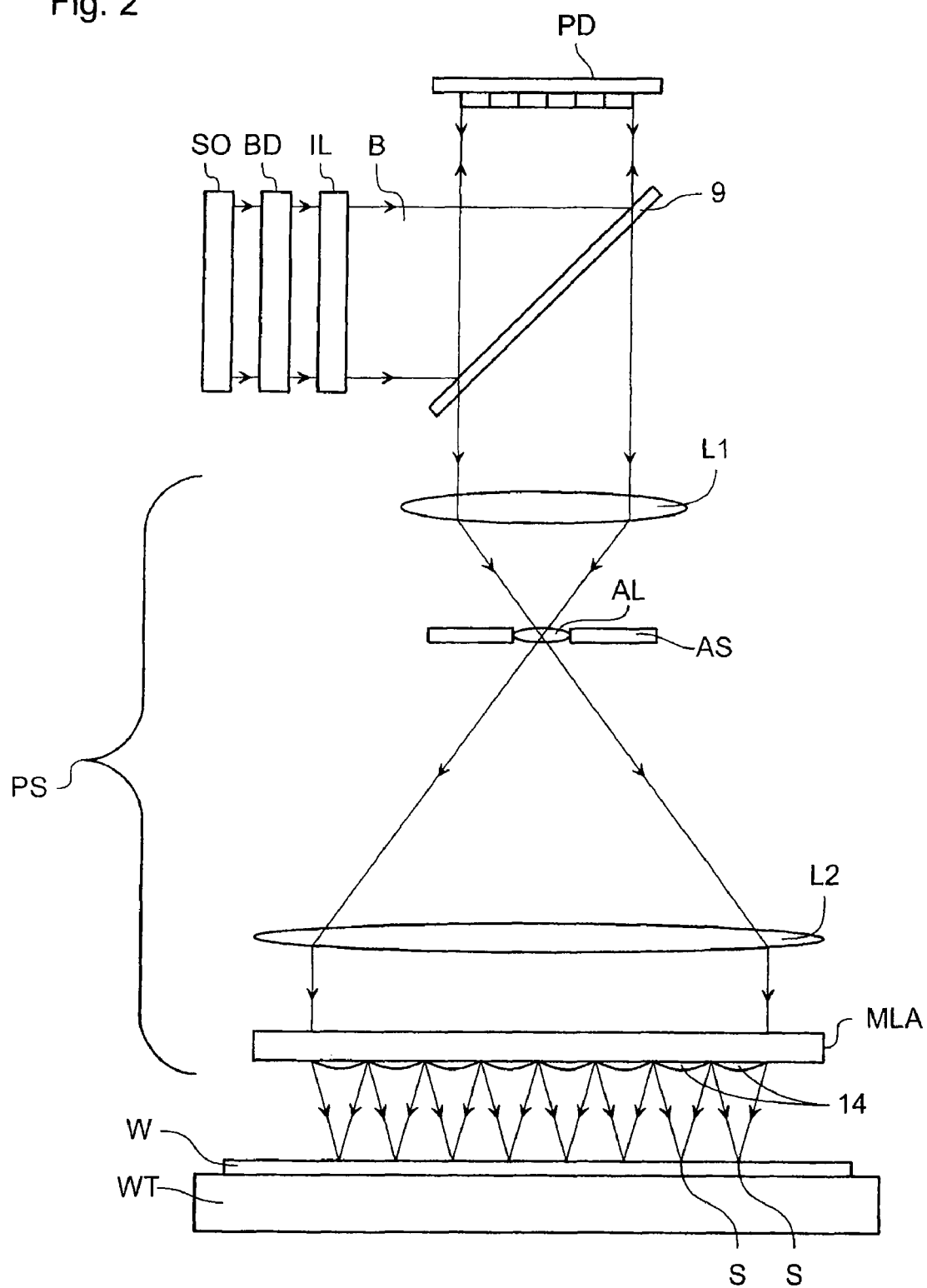

As herein depicted in FIGS. 1 and 2, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In one example, the apparatus is absent at least a short stroke module for moving substrate table WT. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 can not be required if a transmissive patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (namely just a maximum value and a minimum value). In an embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In an embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (namely a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

FIG. 2 depicts an arrangement of a lithographic apparatus, according to one embodiment of the present invention. This embodiment can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
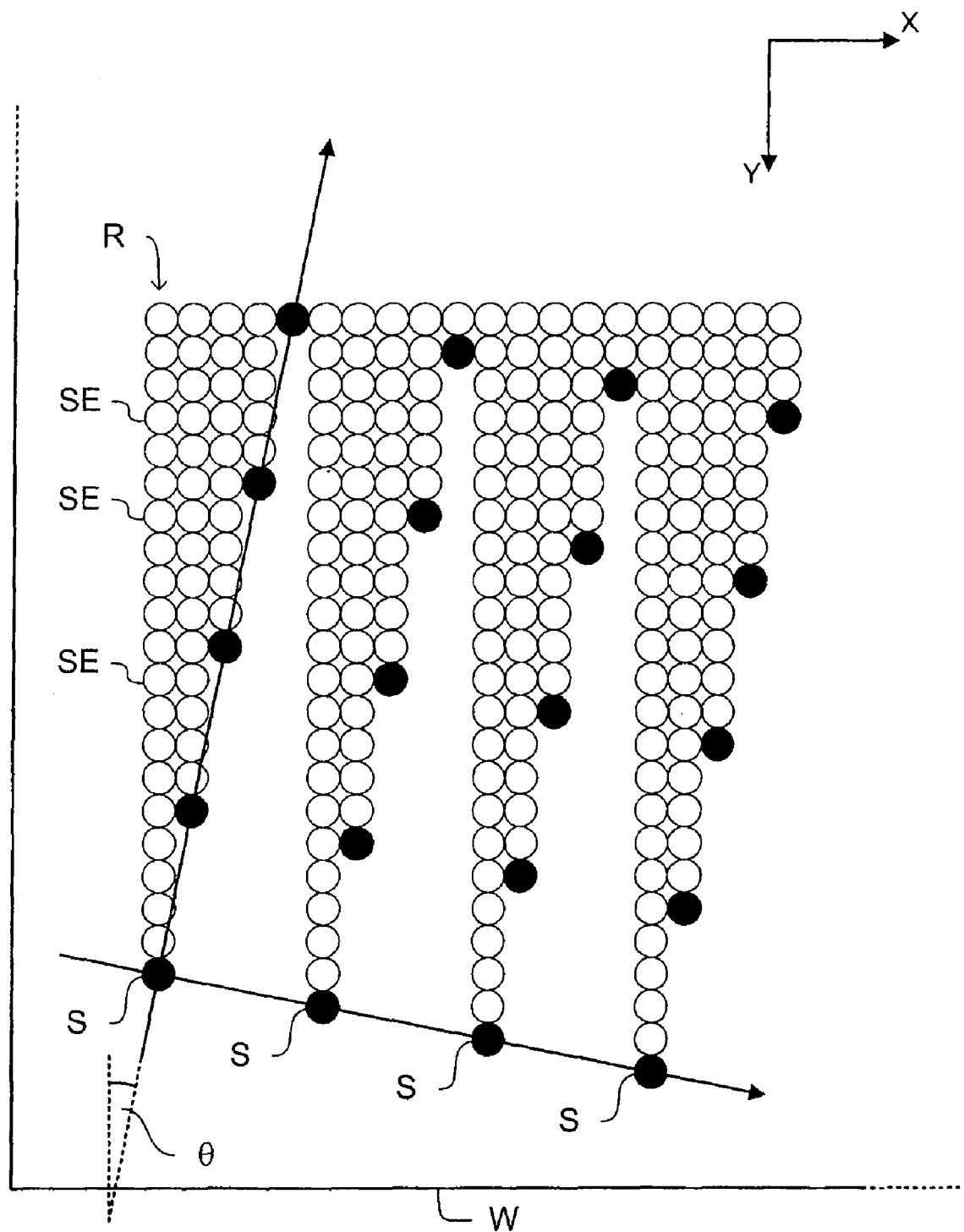
FIG. 3 depicts a mode of transferring a pattern to a substrate according to an embodiment of the invention as show in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. In one example, the angle θ is at most 20°, 10°, e.g., at most 5°, at most 3°, at most 1°, at most 0.5°, at most 0.25°, at most 0.10°, at most 0.05°, or at most 0.01°. In one example, the angle θ is at least 0.001°.

Figure 4:
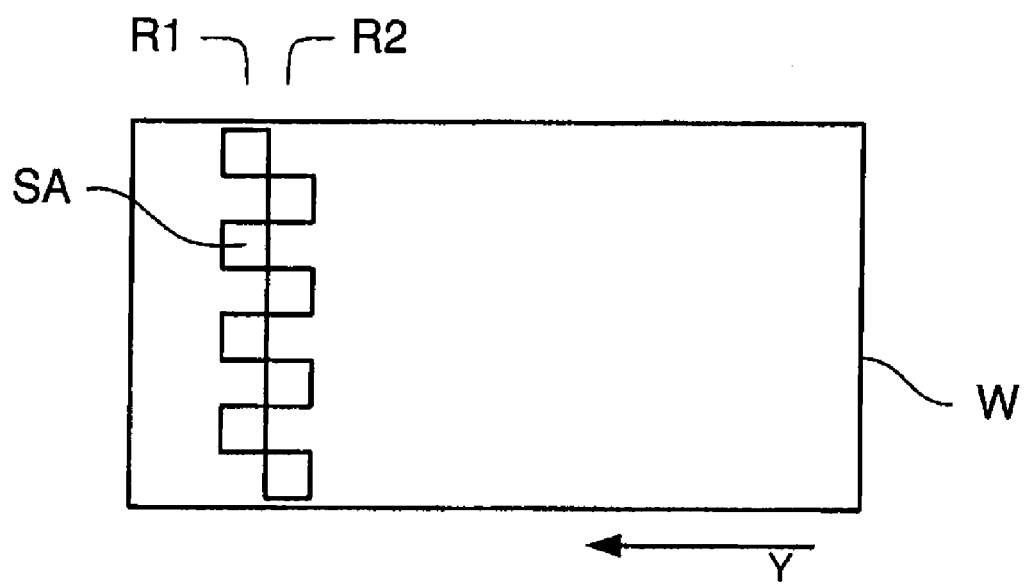
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots S slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, e.g., at least 2, at least 4, at least 8, at least 10, at least 12, at least 14, or at least 17. In one example, the number of optical engines is less than 40, e.g., less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Figure 5:
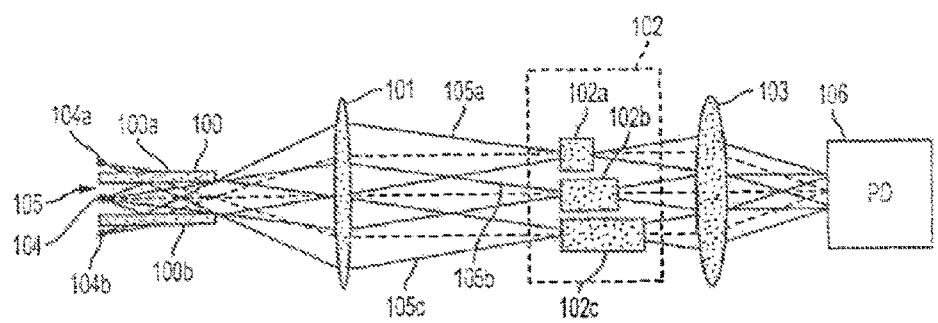
FIGS. 5 to 12 depict a variety of optical apparatus, according to various embodiments of the present invention.

FIG. 5 shows components of the illuminator IL, according to one embodiment of the present invention. The illuminator IL components comprise a homogenizer 100, a first convex lens 101, a set of transmissive rods 102, and a second convex lens 103. It is to be appreciated that the illuminator components shown in FIG. 5 can be used in the illuminators IL shown in FIGS. 1, 2 and/or 3. Also, it is to be appreciated that the illuminator components shown in FIG. 5 can be used instead of, or in addition to, some or all of the components of the illuminator components shown in FIG. 1.

In one example, the homogenizer 100 comprises first and second reflectors 100a and 100b which are parallel to one another and equidistant from a light source 104. The first and second reflectors 100a, 100b can comprise flat outer surfaces of a suitably dimensioned piece of, for example, quartz, or any other suitable material. Alternatively, the first and second reflectors 100a, 100b can comprise two parallel mirrors. The positions and orientations of the mirrors can be adjustable in order to optimize their operation.

In one example, the light source is arranged to generate a beam of light 105, and can, for example, comprise a laser, or can instead be an output from a beam delivery system arranged to deliver light from a laser. The term 'light' should not be interpreted as being limited to electromagnetic radiation in the visible spectrum, but instead should be understood to include any wavelength of electromagnetic radiation which is suitable for use in lithography, as discussed above.

As shown schematically in FIG. 5, due to the reflective nature of the first and second reflectors 100a, 100b, three light beams (or sources) are transmitted through an exit plane of the homogenizer 100 (this is instead of the single beam that would be present in the absence of the homogenizer). The three light beams can be considered to comprise one real light source 104, and two virtual light sources 104a, 104b which are images of the real light source. It will be appreciated by those skilled in the art that the homogenizer 100 can be modified such that more, or less, than three light beams are apparent at an exit of the homogenizer 100.

The first convex lens 101 focuses light from the light sources 104, 104a, 104b, such that light from each of the light sources is directed to a different transmissive rod 102a-c. The light can be considered to be three separate beams of light 105a-c. It will be appreciated by those skilled in the art that the input of the homogenizer 100 can be under-filled by the beam of light 105 generated by the light source 104, in order to generate the three separate beams of light 105a-c. The first convex lens 101 is arranged such that waists of the beams of light 105a-c are aligned with the transmissive rods 102a-c.

As mentioned above, in one example each of the transmissive rods 102a-c is formed from quartz. However, the transmissive rods 102a-c can instead be formed from any other suitable material that is transparent at the wavelength of the light generated by the light source 104. In this example, a first rod 102a is shorter than the second rod 102b. The difference in length of the rods 102a and 102b is selected based upon the coherence length in an axial direction of the beam of light 105 generated by the optical source 104. The length difference is such that two beams of light 105a and 105b that were coherent upon entering the rods 102a and 102b are no longer coherent when they exit the rods 102a and 102b. This length difference is determined by comparison of the path length traveled by the beam of light 105a which passes through the first rod 102a, with the path length traveled by the beam of light 105b which passes through the second rod 102b.

In this example, the third rod 102c is longer than the second rod 102b. The length difference is such that two beams of light 105b and 105c that were coherent upon entering the rods 102b and 102c are no longer coherent when they exit the rods 102b and 102c. This length difference is determined by comparison of the path length traveled by the beam of light 105b, which passes through the second rod 102b, with the path length traveled by the beam of light 105c, which passes through the third rod 102c. Because the refractive index of a rod is greater than that of air, the wavelength of the light is compressed when it is in the rod. This means that the light goes through more wavelength cycles when it is in the rod than if it were in the air. This is expressed by saying that the path length of the light has been increased.

In one example, the second convex lens 103 is arranged to focus the beams of light 105a-c into a single beam. Although FIG. 5 shows the beams of light 105a-c as being spatially separated from one another in a focal plane 106, this is for use of illustration only. Instead, the beams 105a-c are arranged such that they combine with one another at the focal plane 106, thereby forming a single beam of light. In various examples, this single beam of light can be sent directly to a patterning device PD as shown schematically in FIG. 5, or can alternatively be directed to the patterning device via a beam splitter (for example as shown in FIGS. 1 and 2) or some other suitable beam transmission means.

In the example shown, the embodiment of the invention shown in FIG. 5 homogenizes the beam 105 generated by the light source 104, while avoiding interference problems that are seen in conventional systems, which can be due to the overlap of coherent beams. The example shown can allow coherence to removed from a beam that is highly coherent (e.g., a beam generated by a high coherence laser). Existing conventional coherence removers may not be capable of achieving this. This can be desirable, for example, in the field of flat panel display manufacture because it allows a very high intensity light source to be used (such light sources are commonly highly coherent).

In the example shown, the system shown in FIG. 5 operates in one dimension only. This is for ease of illustration, and it will be appreciated that the apparatus can be arranged to operate in two dimensions by making suitable modifications. For example a two dimensional array of rods can be used, and the lenses 101, 103 can be spherical (cylindrical lenses would be used in a one-dimensional system).

In one example, the f-numbers of the beams are chosen to be sufficiently large that the variations in optical path length do not have an appreciable effect on the beam that is incident upon the patterning device PD (e.g., telecentricity, field curvature, etc).

It will be appreciated that the rods 102, which act as a coherence remover, can be replaced by an alternative coherence remover. For example, any suitable apparatus that requires each of the beams 105a-c to travel through different path lengths and then recombines the beams can be used. The term 'coherence remover' is not intended to be limited to an apparatus that entirely removes all coherence, but instead is intended to mean an apparatus that removes at least some coherence, such that operation of a lithographic apparatus in which the coherence remover is provided is not significantly compromised by problems arising from coherent light.

Figure 6:
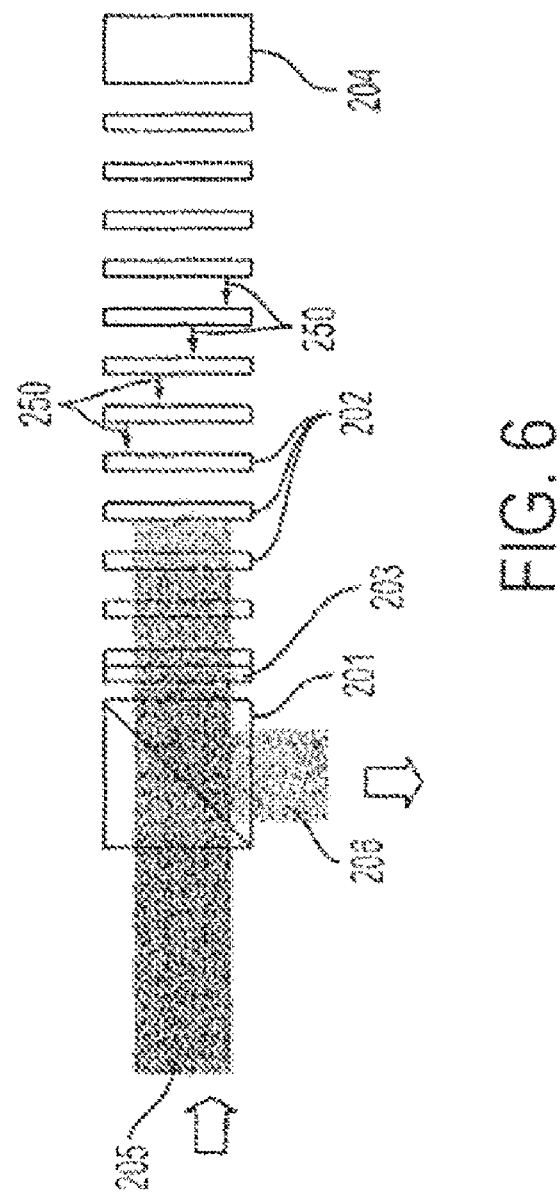

FIG. 6 shows a coherence removing apparatus that can be used to remove coherence from a single beam of light, according to one embodiment of the present invention. The coherence removing apparatus comprises a beam splitter 201 and a series of lightly wedged partially reflecting plates 202. In one example, the term "lightly wedged" is intended to mean that there is a small angle relative to the normal to an axis of the optics. A quarter wave plate 203 is located adjacent to the beam splitter 201, and a fully reflecting mirror 204 is placed after a final partially reflecting plate 202. In one example, the beam splitter 201 is a polarizing beam splitter and the quarter wave plate 203 is set up so that light of a first polarization passes through the polarizing beam splitter 201, but is reflected on its return to the polarizing beam splitter 201. In another example, an equivalent configuration can be used such that the light is first reflected by the polarizing beam splitter 201 and is then transmitted on its return to the polarizing beam splitter 201.

In one example, a collimated beam of light 205 passes through the polarizing beam splitter 201 and the quarter wave plate 203, and then is incident upon the partially reflecting plates 202. Each of the partially reflecting plates 202 will reflect a portion 250 of the beam of light 205. Since the partially reflecting plates 202 are "lightly wedged," and the air gap between the partially reflecting plates is "lightly wedged," each different reflection of the beam of light 205 will have a slightly different tilt with respect to other reflections of the beam. The separation between the partially reflecting plates 202 is selected such that the reflected portions 250 of the beam of light 205 are not coherent with respect to one another. Thus, an output beam 206 is not coherent and does not suffer from interference problems. The output beam 206 can be directed, for example, at a homogenizer or at a patterning device.

Figure 7A:
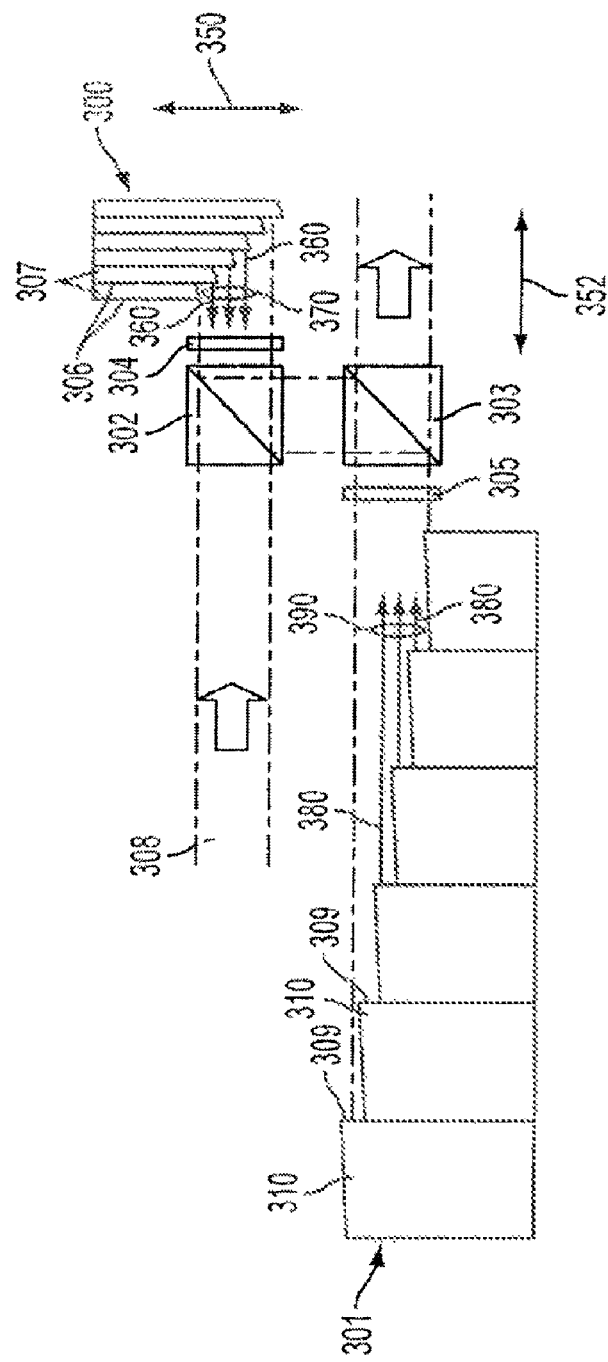

FIG. 7A shows a further alternative apparatus for removing coherence, according to one embodiment of the present invention. This apparatus comprises a first set of stepped mirrors 300 and a second set of stepped mirrors 301. A pair of polarizing beam splitters 302, 303 and associated quarter wave plates 304, 305 are arranged to pass radiation to and from the first and second sets of stepped mirrors 300, 301.

In one example, the first set of stepped mirrors 300 comprises six mirrors, each of which is reflective on a left hand surface 306 (the surface can have a different orientation in a different configuration of the apparatus). Each of the reflective services 306 is provided on a substrate 307, the substrates being bonded together to form the first set of stepped mirrors 300. Each substrate 307 is selected to be just thicker than the coherence length of a beam of light 308 from which the coherence is to be removed. It will be appreciated that this thickness is determined in terms of the path length traveled by the beam of light 308 in, for example, air, other ambient mediums, vacuum, etc., and not the path length within the substrate itself. Each substrate 307 has an angled lower edge, such that the location at which a given substrate 307 comes into contact with a reflective surface 306 provided on an adjacent substrate is not visible to the beam of light 308.

In one example, when in use the beam of radiation 308 passes through the polarizing beam splitter 302 and the quarter wave plate 304, and different portions of the beam 360 are reflected from the reflective surfaces 306 of the first set of stepped mirrors 300. Due to the different path lengths traveled by different portions 360 of the first reflected beam of radiation 370, the portions 360 are not coherent with one another following reflection from the first set of stepped mirrors 300. The quarter wave plate 304 then rotates the polarization of the first reflected beam of radiation 370 such that it is then reflected by the polarizing beam splitter 302.

Figure 7B:
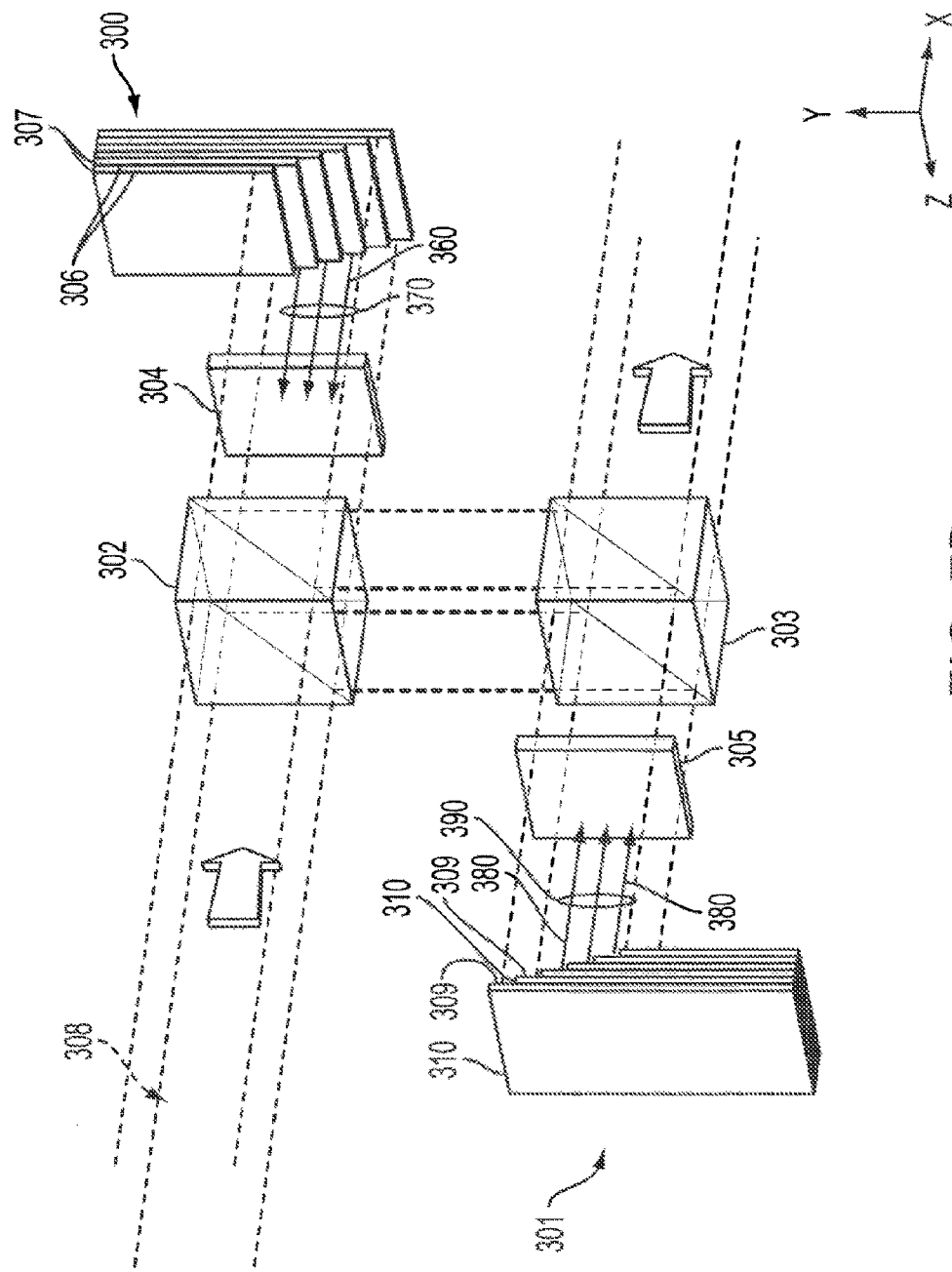
Figure 7C:
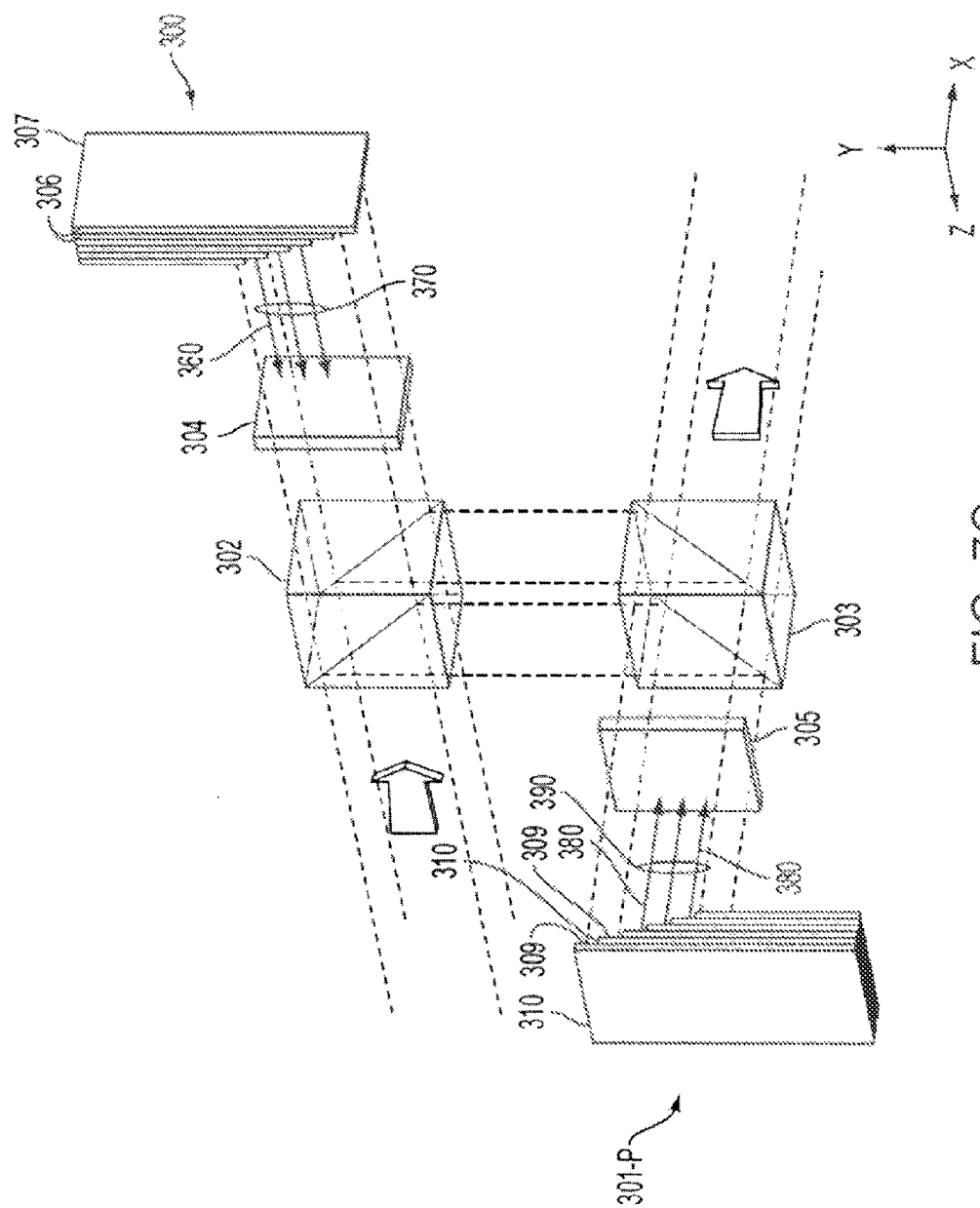

It will be appreciated that, in this example, coherence has only been removed from the first reflected beam 370 in one axis 350 by the action of the first set of stepped mirrors 300. Coherence is removed from the first reflected beam 370 in a second axis 352 by using the second set of stepped mirrors 301. These are shown for ease of illustration as being stepped in the same plane as the first set of stepped mirrors 300, e.g., in the horizontal direction of the paper of FIG. 7A, and in a three dimensional view in FIG. 7B. However, in practice the second set of stepped mirrors 301 is provided in a perpendicular plane, as is illustrated by 301-P, such that coherence is removed from the first reflected beam of radiation 370 in a third axis. In the context of FIG. 7C, the second set of stepped mirrors 301 will be perpendicular to the plane of the paper on which FIG. 7A is shown as is illustrated by 301-P in FIG. 7C. When the second set of stepped mirrors are placed perpendicular to the plane of the paper as shown by 301-P the stepped mirrors receive beam 308 in the z-direction.

In one example, the second set of stepped mirrors 301 comprises reflective surfaces 309 each provided on a substrate 310. The thickness of the substrate 310 is greater than the distance between first and final reflective surfaces 306 of the first set of stepped mirrors 300. This ensures that the second set of stepped mirrors 301 does not have the effect of returning coherence to portions of the first reflected beam of radiation 370. The first reflected beam of radiation 370 is then reflected by the second polarizing beam splitter 303, passes through the second quarter wave plate 305 and is reflected by the reflective surfaces 309 of the second set of stepped mirrors 301. Due to the different path lengths traveled by different portions 380 of the second reflected beam of radiation 390, the portions 380 are not coherent with one another following reflection from the second set of stepped mirrors 301. The second reflected beam of radiation 390 then passes through the quarter wave plate 305 and the second polarizing beam splitter 303, from where it can be directed, for example, at a homogenizer or at a patterning device.

Following the action of the first and second sets of stepped mirrors 300, 301, the beam of light 308 is divided transversely in two dimensions into square or rectangular regions each of which is not coherent with respect to its neighbors.

The embodiment described above in relation to FIG. 5 included a homogenizer 100, which was located before a coherence remover 102. However, it will be appreciated that in other embodiments that a homogenizer can be located after a coherence remover.

Figure 8:
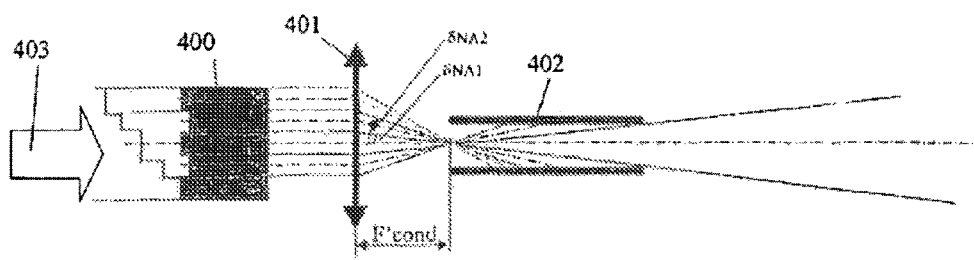

FIG. 8 shows a homogenizer located after a coherence remover, according to one embodiment of the present invention. The coherence remover comprises a set of transmissive elements 400 that is placed before a condensing lens 401 and the homogenizer comprises a quartz rod 402 with planar reflecting upper and lower surfaces. Each element of the set of transmissive elements 400 has an optical path length that is different than that of its neighbors. For example, this difference can be greater than the coherence length of the light source. In one exemplary arrangement, alternating long and short transmissive elements are provided. In another exemplary arrangement (shown in outline) a series of stepped transmissive elements are provided.

Figure 9:
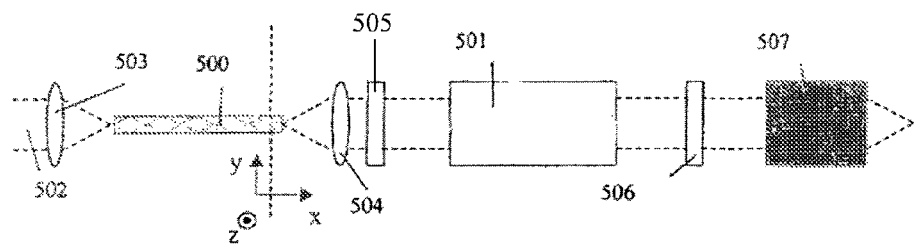

FIG. 9 shows a homogenizer, according to one embodiment of the present invention. The homogenizer can be used, for example, wherever a homogenizer is referred to in the above description. The homogenizer comprises a first quartz plate 500 and a second quartz plate 501, which is arranged in an orientation that is transverse to the first quartz plate 500. A beam of light 502 that is to be homogenized passes via a first cylindrical condensing lens 503 into the first quartz plate 500. Internal reflections from the surfaces of the first quartz plate 500 cause the beam 502 to be homogenized in the y-direction (Cartesian coordinates are shown in FIG. 9 for ease of illustration). A second cylindrical condensing lens 504 forms the beam 502 into a collimated circular beam, which passes through a third cylindrical lens 505 that has an orientation that is rotated through 90 degrees compared with the second cylindrical lens 504. The beam 502 then passes into the second homogenizer plate 501, where it is homogenized in the z-direction. Upon leaving the second homogenizer plate 501, the beam 502 is converted by a fourth cylindrical lens 506 into a collimated circular beam. Cylindrical optics 507 then adjust the beam 502, such that images of the first and second quartz plates 500 and 501 coincide.

Although the homogenizer shown in FIG. 9 comprises first and second quartz plates 500, 501, it is to be appreciated that two parallel mirrors can, in the alternative, be used to provide the function of a given quartz plate. Also, the positions and orientations of the mirrors can be adjustable in order to optimize their operation. A plate formed from any other suitable material can be used in place of the quartz plate.

Figure 10:
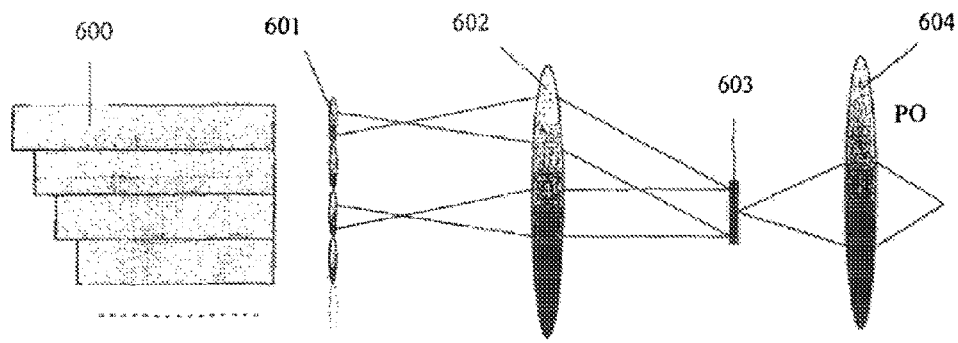

FIG. 10 illustrates an alternative combination of coherence remover and homogenizer, according to one embodiment of the present invention. A coherence remover comprises a stepped series of transmissive rods 600 located next to an array of lenses 601. The stepped series of transmissive rods 600 and the array of lenses 601 can be provided in two dimensions, a single dimension being shown in FIG. 10 for ease of illustration. The array of lenses 601 is arranged such that each lens focuses light exiting from a given transmissive rod 600 onto a condensing lens 602. The condensing lens 602 focuses light from each of the lenses of the lens array 601 onto a diffractive optical element 603. The condensing lens 602 is arranged such that light that has passed through each of the lenses of the lens array 601 converges at the diffractive optical element 603, thereby forming a single beam of light. In one example, the diffractive optical element 603 comprises one or more diffraction patterns that are arranged to diffract light into a beam with a configuration that can be passed through projection optics (not shown) of a lithographic apparatus (not shown). A first lens 604 of the projection optics is shown schematically in FIG. 10.

In one example, the diffractive optical element 603 is located in a plane that is conjugate to the array of lenses 601. This location of the diffractive optical element 603 is desirable because it avoids defocusing of a phase structure provided by the stepped series of transmissive rods 600, and thereby avoids amplitude modulation and corresponding intensity non-uniformity.

In one example, the stepped series of transmissive rods 600 and the array of lenses 601 can, for example, be provided in an 8×8 configuration. When this is done, a beam of light passing therethrough will be converted into an array of 64 beams that are out of phase with one another. The beams are mixed (i.e., homogenized) by the diffractive optical element 603, with the effect that a single homogenized beam passes to the first optic 604. The homogenized beam does not include intensity modulation caused by interference (i.e., coherence has been removed to a sufficient extent that no appreciable interference occurs). The diffractive optical element 603 can be used to convert the beam of light into a required beam shape, which can then be directed to the projection optics.

Figure 11:
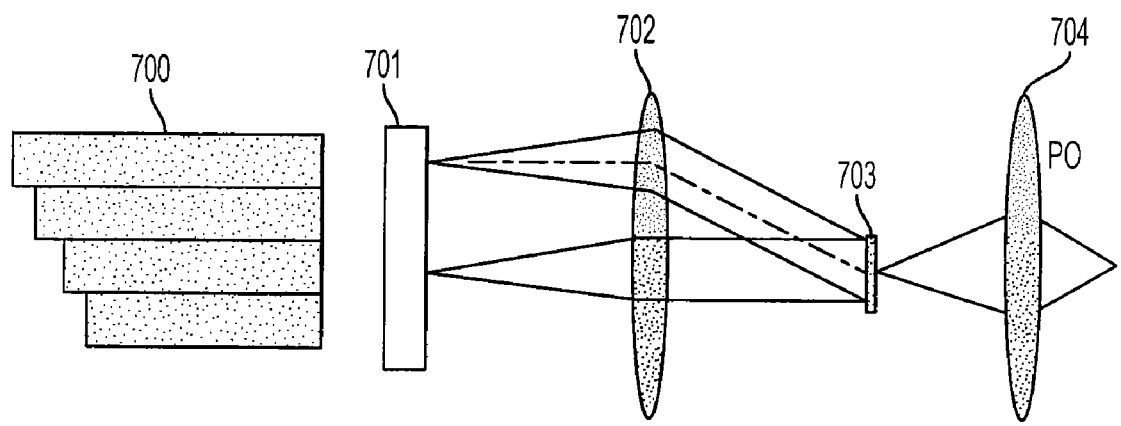

FIG. 11 shows a coherence removal and homogenizing apparatus, according to one embodiment of the present invention. This embodiment is similar to the embodiment shown in similar to that of FIG. 10. Referring to FIG. 11, a stepped series of transmissive rods 700 is located next to a diffractive optical element 701. The diffractive optical element 701 separately directs each beam output from a given transmissive optical element to a condensing lens 702. Each beam of light output by the diffractive optical element 701 passes through a condensing lens 702, which converges the beams of light so that they spatially overlap with one another at a second diffractive optical element 703. The overlapping beams of light form a homogenized beam of light, which is converted to a required beam shape by the second diffractive optical element 703.

Although only four transmissive rods 700 are shown in FIG. 11, it will be appreciated that in practice this can be a two-dimensional array of rods, which can, for example, comprise 8×8 rods. Similarly, the diffractive optical element 701 can be arranged to provide 64 beams that are pass to the focused by the condensing lens 702.

In the above described embodiments of the invention, where a homogenizer comprising first and second reflectors is used the reflectors are described as being parallel to one another. However, the reflectors can be angled relative to one another.

Figure 12:
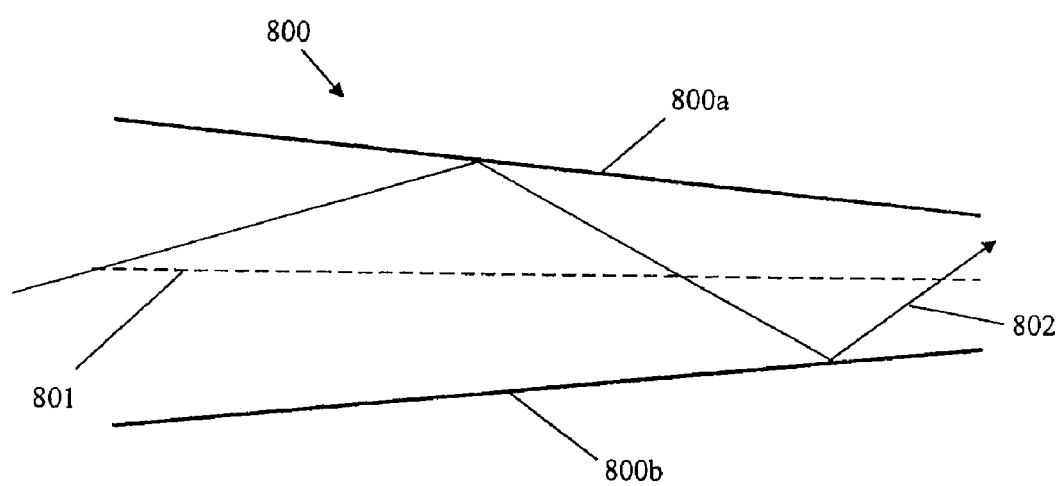

FIG. 12 shows homogenizer comprising first and second reflectors angled relative to one another, according to one embodiment of the present invention. A homogenizer 800 comprises a first plate 800a and a second plate 800b, each of which is angled relative to a central axis indicated by dotted line 801. This has the effect of making the entrance window of the homogenizer 800 greater than the exit window, so that exit angles of light passing out of the homogenizer 800 are greater than entrance angles of light passing into it. This is shown schematically by arrow 802. Adjusting the angular orientation of the homogenizer plates 800a and 800b allows the sigma of light passing through the homogenizer 800 to be adjusted. In one example, the plates 800a and 800b of the homogenizer 800 are rotatably mounted to allow their angular orientation to be adjusted. This in turn allows the sigma of the light to be adjusted. In an embodiment, the substantially fully reflective mirror is angled with respect to the normal axis of the first and second partially reflective surfaces.

The above description refers to light, light sources and beams of light. It will be appreciated that the light referred to is not limited to light having a visible wavelength, and can include other wavelengths including ultraviolet light or infrared light which are suitable for lithography, as discussed above.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus can be used to assist in the creation of a variety of layers, e.g. a thin film transistor layer and/or a color filter layer.

Although specific reference can have been made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention can be practiced otherwise than as described. For example, the invention can take the form of a computer program containing one or more sequences of machine-readable instructions describing a method as disclosed above, or a data storage medium (e.g. semiconductor memory, magnetic or optical disk) having such a computer program stored therein.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A coherence remover, comprising:
   a first partially reflective surface;
   a second partially reflective surface separated from the first partially reflective surface by a fixed distance along a normal axis of the first and second partially reflective surfaces;
   a polarizing beam splitter configured to receive an input beam and to pass the input beam having a first polarization such that the input beam is incident on the first and second partially reflective surfaces,
      wherein each of the first and second partially reflective surfaces is configured to reflect a respective portion of the input beam to produce one or more respective intermediate beams, and to pass the non-reflected portion of the input beam;
   a substantially fully reflective mirror configured to reflect a portion of the input beam to produce additional intermediate beams,
      wherein the one or more respective intermediate beams and the additional intermediate beams collectively form an output beam that has a reduced coherence compared to the input beam; and
   a quarter wave plate configured to alter a polarization state of the output beam,
      wherein the polarizing beam splitter is configured to receive the altered output beam having a second polarization and to reflect the altered output beam.

2. The coherence remover of claim 1, wherein at least one of the first and second partially reflective surfaces is angled with respect to the a central axis of the first and second partially reflective surfaces.

3. The coherence remover of claim 1, wherein the substantially fully reflective mirror is angled with respect to the normal axis of the first and second partially reflective surfaces.

4. The coherence remover of claim 1, wherein the coherence remover is configured to output the output beam to a homogenizer or a patterning device.

5. A lithographic apparatus, comprising:
   a coherence remover, comprising:
      a first partially reflective surface;
      a second partially reflective surface separated from the first partially reflective surface by a fixed distance along a normal axis of the first and second partially reflective surfaces;
      a polarizing beam splitter configured to receive an input beam and to pass the input beam having a first polarization such that the input beam is incident on the first and second partially reflective surfaces,
         wherein each of the first and second partially reflective surfaces is configured to reflect a respective portion of the input beam to produce one or more respective intermediate beams, and to pass the non-reflected portion of the input beam;
      a substantially fully reflective mirror configured to reflect a portion of the input beam to produce additional intermediate beams,
         wherein the one or more respective intermediate beams and the additional intermediate beams collectively form an output beam that has a reduced coherence compared to the input beam; and
      a quarter wave plate configured to alter a polarization state of the output beam,
         wherein the polarizing beam splitter is configured to receive the altered output beam having a second polarization and to reflect the altered output beam; and
   a homogenizer configured to convert the output beam into a plurality of beams.

6. The lithographic apparatus of claim 5, further comprising:

a patterning device configured to modulate the plurality of beams such that a pattern is formed on a substrate that receives the modulated plurality of beams.

7. The lithographic apparatus of claim 5, wherein the homogenizer comprises first and second homogenizer reflectors that are angled relative to one another.

8. The lithographic apparatus of claim 7, wherein the homogenizer reflectors are rotatably mounted, such that an angular orientation of the homogenizer reflectors is adjustable.

9. The lithographic apparatus of claim 7, wherein the homogenizer comprises:

a first homogenizer module configured to homogenize the output beam in a first direction; and a second homogenizer module configured to homogenize an output of the first homogenizer module in a second direction, wherein the first direction is perpendicular to the second direction.

10. The lithographic apparatus of claim 9, wherein at least one of the first homogenizer module and the second homogenizer module comprises at least one of a plate or two parallel mirrors.

* * * * *